United States Patent
Wang (10) Patent No.: US 8,291,286 B2
(45) Date of Patent: Oct. 16, 2012

(54) DECODING SYSTEM AND METHOD FOR HIGH-DENSITY RECORDING MEDIUM

(75) Inventor: Sih-Kai Wang, Tainan (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 559 days.

(21) Appl. No.: 12/591,814

(22) Filed: Dec. 2, 2009

(65) Prior Publication Data

US 2010/0180177 A1     Jul. 15, 2010

(30) Foreign Application Priority Data

Jan. 13, 2009    (TW) ................................ 98101013 A (51) Int. Cl.
  *G06F 11/00*    (2006.01)
(52) U.S. Cl. ........................................................ 714/752
(58) Field of Classification Search .................... 714/752
  See application file for complete search history.

(56) References Cited

U.S. PATENT DOCUMENTS

| | | | | |
|---|---|---|---|---|
| 7,281,193 B2* | 10/2007 | Wu et al. | ........................ | 714/758 |
| 7,877,661 B2* | 1/2011 | Kahlman | ........................ | 714/752 |
| 8,069,398 B2* | 11/2011 | Wu et al. | ........................ | 714/776 |
| 2003/0115529 A1* | 6/2003 | Ohira et al. | ........................ | 714/752 |
| 2006/0069979 A1* | 3/2006 | Wu et al. | ........................ | 714/758 |
| 2007/0277080 A1* | 11/2007 | Wu et al. | ........................ | 714/758 |
| 2010/0017679 A1* | 1/2010 | Kawamae et al. | ........................ | 714/752 |

\* cited by examiner

*Primary Examiner* — Bryce Bonzo
(74) *Attorney, Agent, or Firm* — Bacon & Thomas, PLLC (57) ABSTRACT

In a decoding system and method for a high-density recording medium, a high protective codeword decoder decodes a burst indicator subcode (BIS) while a low protective codeword decoder decodes a long distance code, so as to eliminate the waiting time required for completely decoding all burst indicator subcodes (BISs) and starting the long-distance code (LDC) decoding. In addition, a first memory having a high access speed is implemented to store the BISs and corresponding BIS erasure indicators, and the access to a second memory have a lower access speed relative to the first memory is relatively reduced such that the bandwidth can be effectively used to thereby increase the decoding efficiency on the high-density recording medium.

19 Claims, 11 Drawing Sheets

|  codeword 0 | codeword 1 | ... | codeword C | ... | codeword 22 | codeword 23 |
|---|---|---|---|---|---|---|
| $b_{0,0}$ | $b_{0,1}$ | | $b_{0,C}$ | | | $b_{0,23}$ |
| $b_{1,0}$ | $b_{1,1}$ | | $b_{1,C}$ | | | $b_{1,23}$ |
| .. | .. | | .. | | | .. |
| .. | .. | | .. | | | .. |
| $b_{29,0}$ | $b_{29,1}$ | | $b_{29,C}$ | | | $b_{29,23}$ |
| $b_{30,0}$ | $b_{30,1}$ | | $b_{30,C}$ | | | $b_{30,23}$ |
| .. | .. | | .. | | | .. |
| .. | .. | | .. | | | .. |
| $b_{61,0}$ | $b_{61,1}$ | | $b_{61,C}$ | | | $b_{61,23}$ |

24 columns 30 information
32 parity

1 BIS codeword = 62 bytes

FIG. 3

| unit u | row r | byte number N,C from BIS Block 0 | 1 | 2 | shift right (=mod (r,3)) | filling in upward direction |
|---|---|---|---|---|---|---|
| 0 | 0 | 0, 0 | 0, 1 | 0, 2 | 0 | start of Block row N=0 |
| | 1 | 2, 5 | 2, 3 | 2, 4 | 1 | ↑continuation of Block row N=2 |
| | 2 | 4, 7 | 4, 8 | 4, 6 | 2 | |
| | 3 | 6, 9 | 6, 10 | 6, 11 | 0 | |
| | ⋮ | | | | | |
| | 7 | 14, 23 | 14, 21 | 14, 22 | 1 | |
| | 8 | 16, 1 | 16, 2 | 16, 0 | 2 | start of Block row N=16 |
| | ⋮ | | | | | |
| | 30 | 60, 18 | 60, 19 | 60, 20 | 0 | |
| 1 | 0 | 0, 21 | 0, 22 | 0, 23 | 0 | start of Block row N=0 |
| | 1 | 2, 2 | 2, 0 | 2, 1 | 1 | start of Block row N=2 |
| | 2 | 4, 4 | 4, 5 | 4, 3 | 2 | |
| | 3 | 6, 6 | 6, 7 | 6, 8 | 0 | |
| | ⋮ | | | | | |
| 2 | 0 | 0, 18 | 0, 19 | 0, 20 | 0 | |
| | 1 | 2, 23 | 2, 21 | 2, 22 | 1 | end of Block row N=2 |
| | 2 | 4, 1 | 4, 2 | 4, 0 | 2 | start of Block row N=4 |
| | 3 | 6, 3 | 6, 4 | 6, 5 | 0 | |
| | ⋮ | | | | | |
| 3 | 0 | 0, 15 | 0, 16 | 0, 17 | 0 | |
| | 1 | 2, 20 | 2, 18 | 2, 19 | 1 | |
| | 2 | 4, 22 | 4, 23 | 4, 21 | 2 | |
| | 3 | 6, 0 | 6, 1 | 6, 2 | 0 | start of Block row N=6 |
| | ⋮ | | | | | |
| 4 | 0 | 1, 12 | 0, 13 | 0, 14 | 0 | |
| | 1 | 2, 17 | 2, 15 | 2, 16 | 1 | |
| | 2 | | | | | |
| | ⋮ | | | | | |
| 5 | 0 | 0, 9 | 0, 10 | 0, 11 | 0 | |
| | 1 | 2, 14 | 2, 12 | 2, 13 | 1 | |
| | 2 | | | | | |
| | ⋮ | | | | | |
| 6 | 0 | 0, 6 | 0, 7 | 0, 8 | 0 | |
| | 1 | 2, 11 | 2, 9 | 2, 10 | 1 | |
| | 2 | 4, 13 | 4, 14 | 4, 12 | 2 | |
| | ⋮ | | | | | |
| 7 | 0 | 0, 3 | 0, 4 | 0, 5 | 0 | ↑continuation of Block row N=0 |
| | 1 | 2, 8 | 2, 6 | 2, 7 | 1 | ↑continuation of Block row N=2 |
| | 2 | 4, 10 | 4, 11 | 4, 9 | 2 | |
| | ⋮ | | | | | |
| | 7 | 14, 2 | 14, 0 | 14, 1 | 1 | start of Block row N=14 |
| | ⋮ | | | | | |
| | 30 | 60, 21 | 60, 22 | 60, 23 | 0 | end of Block row N=60 |

DECODING SYSTEM AND METHOD FOR HIGH-DENSITY RECORDING MEDIUM

BACKGROUND OF THE INVENTION

1. Field of the Invention

The present invention relates to the technical field of optical storage media decoding and, more particularly, to a decoding system and method for high-density recording medium.

2. Description of Related Art

Figure 1:
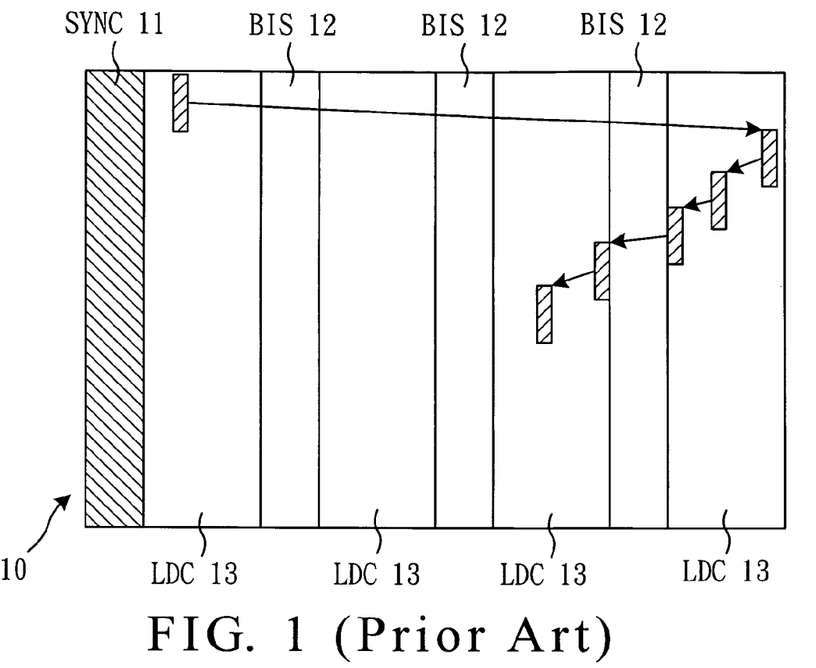
FIG. 1 is a schematic diagram of a typical error correction code (ECC) cluster of a high-density recording medium.

As shown in FIG. 1, an error correction code (ECC) cluster 10 has 152 long distance code (LDC) data columns, a synchronization data column and three burst indicator subcode (BIS) data columns 12. The LDC data columns are divided into four LDC blocks 13 by the synchronization data column 11 and the BIS data columns 12. The original LDC data is discontinuous and interleaved into the different LDC blocks 13. Some ECC coding or decoding techniques are disclosed in U.S. Pat. No. 6,378,100, granted to Van Dijk, et al. for a "Method and apparatus for encoding multiword information with error locative clues directed to low protectivity words", U.S. Pat. No. 6,367,049, granted to Van Dijk, et al. for an "Encoding multiword information by wordwise interleaving", U.S. Pat. No. 6,604,217, granted to Kahlman for a "Multiword information encoded by wordwise interleaving and wordwise error protection with error locative clues derived from synchronizing channel bit groups and directed to target words", U.S. 2003/0208714, published Nov. 6, 2003, entitled "Method for encoding multiword information by wordwise interleaving and wordwise error protection with error locative clues derived from synchronizing channel bit groups and directed to target words, a method for decoding such information, a device for encoding and/or decoding such information, and a carrier provided with such information", and U.S. Pat. No. 7,281,193, granted to Wu, et al. for a "Method and apparatus for decoding multiword information". U.S. Pat. No. 6,378,100 discloses a decoding method in which the synchronization codes, the BIS codes or their dynamic or static combination is used as an erasure, and U.S. 2003/0208714 (a continuation application of U.S. Pat. No. 6,378,100) further discloses a method using a synchronization code as an erasure indicator.

Figure 2:
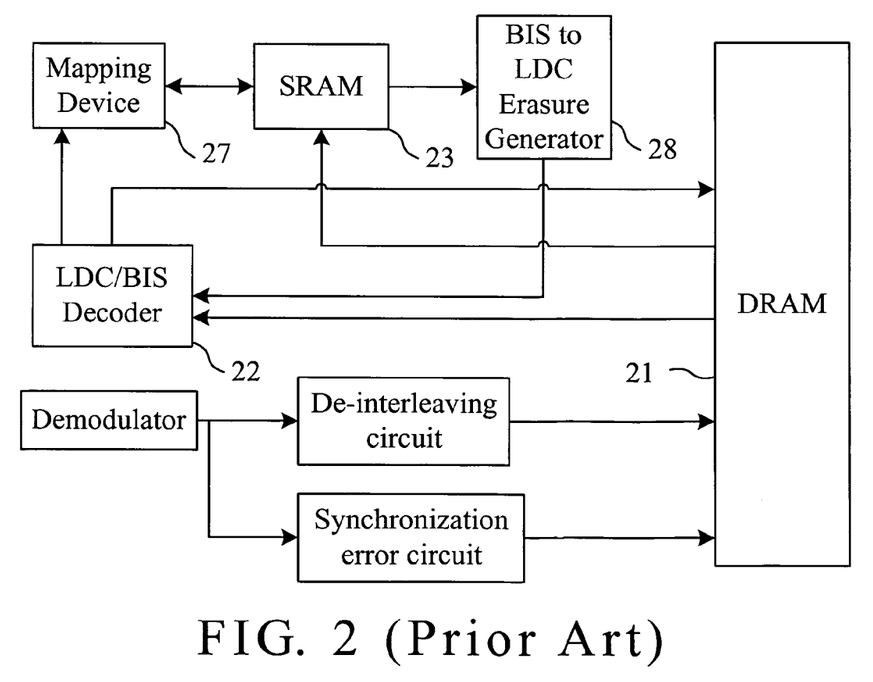
FIG. 2 is a block diagram of a typical decoding system for a high-density recording medium.

However, the aforementioned patents only disclose a concept for the method of decoding ECC data, i.e., they do not explicitly disclose practical implementation methods. To overcome this, U.S. Pat. No. 7,281,193 discloses a decoding method in which the synchronization and BIS codes are combined as a tactic and the tactic can be switched automatically. FIG. 2 is a block diagram disclosed in U.S. Pat. No. 7,281,193 in which the demodulated and de-interleaved BIS and LDC codes are stored in the DRAM 21. The LDC/BIS decoder 22 reads a BIS from the DRAM 21 for decoding and subsequently recording the BIS error flag in the SRAM 23. Next, the LDC/BIS decoder 22 reads an LDC from the DRAM 21 to decode, and the BIS to LDC erasure generator 28 reads the BIS error flag from the SRAM 23 to thereby produce an LDC erasure flag to the LDC/BIS decoder 22 for the LDC decoding. Thus, the LDC decoding performance of the LDC/BIS decoder 22 is increased.

In decoding of a typical high-density recording medium, it firstly completes the BIS decoding in order to obtain the BIS error flag and then decodes the LDC in order to produce the LDC erasure flag based on the BIS error flag, thereby increasing the LDC decoding performance, as cited in the decoding disclosed by U.S. Pat. No. 7,281,193. Such a decoding has a disadvantage that the LDC decoding is not performed unless the BIS decoding is complete. For a future high-speed high-density recording medium, decoding must be performed with high speed and high efficiency. Accordingly, the time waiting for completing the BIS decoding is a waste.

Figure 3:
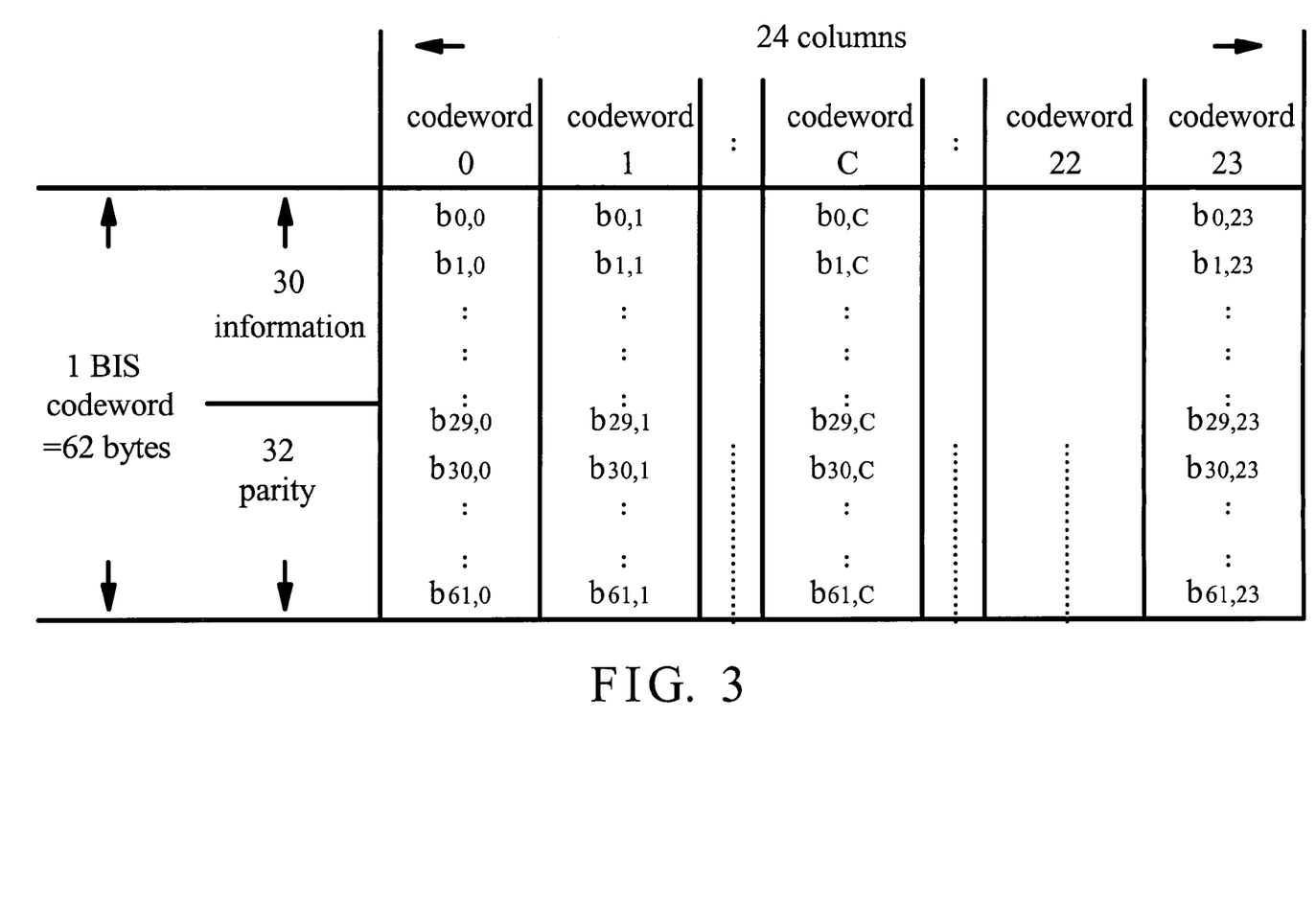
FIG. 3 is a schematic diagram of a typical data format of burst indicator subcode (BIS) blocks.
Figure 4:
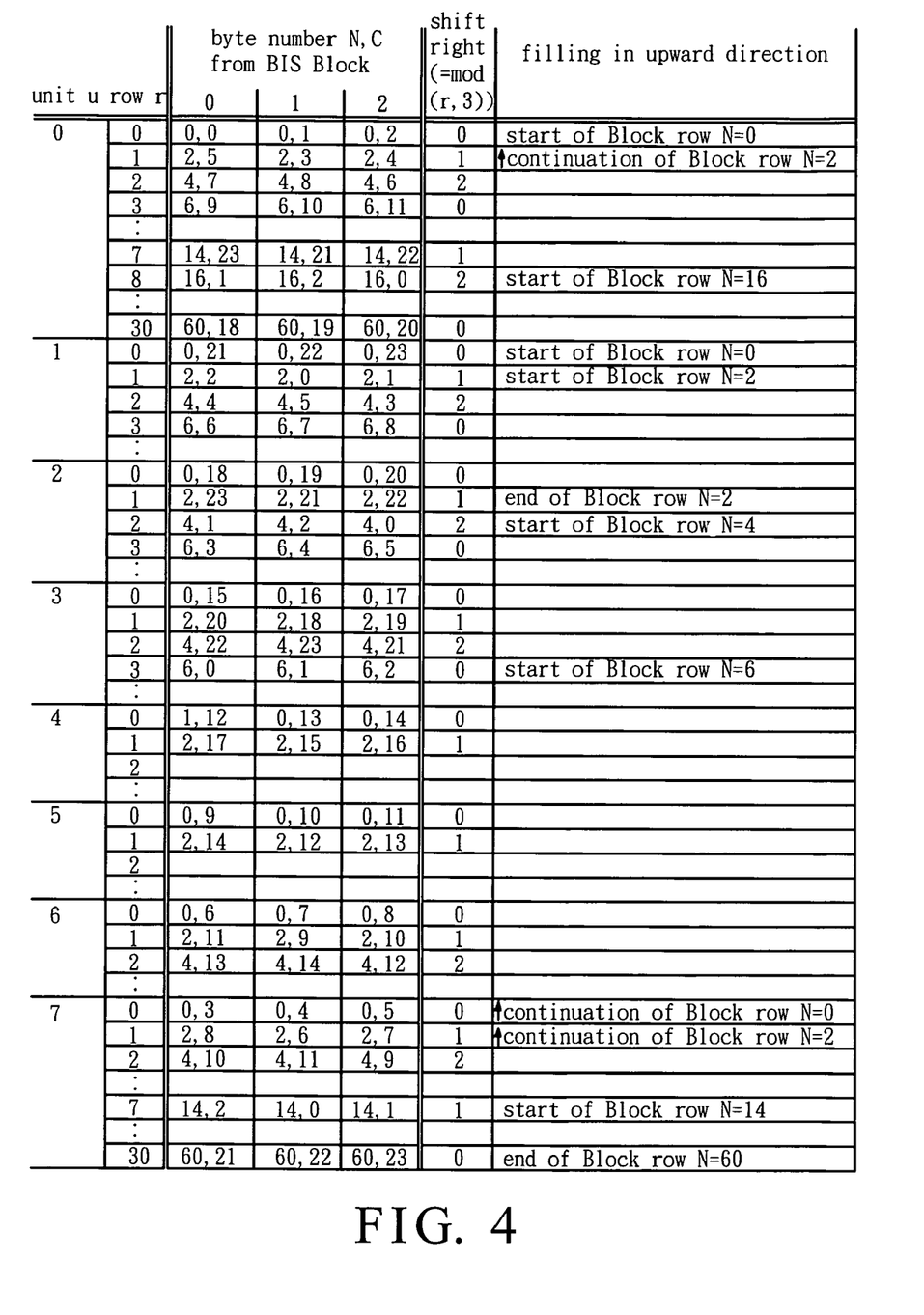
FIG. 4 is a schematic graph of a table of interleaved mapping of partial BISs.

FIG. 3 is a schematic diagram of a data format of BIS blocks. FIG. 4 is a schematic graph of a table of interleaved mapping of partial BISs. As shown in FIGS. 3 and 4, the coordinates of the de-interleaved BISs are not successive (not following the direction of each codeword). Therefore, the demodulated and de-interleaved BISs are stored in the DRAM 21 and the DRAM 21 are then accessed for decoding, which are inefficient and occupy the bandwidth of the DRAM 21. Accordingly, the disclosed method is not suitable for a complicated system application or a high-density recording medium to meet the system performance requirement of high-speed reading.

Therefore, it is desirable to provide an improved decoding system and method to mitigate and/or obviate the aforementioned problems.

SUMMARY OF THE INVENTION

An object of the present invention is to provide a decoding system and method for high-density recording medium, which can eliminate the waiting time required for completely decoding all burst indicator subcodes (BISs) and starting the long-distance code (LDC) decoding to thereby increase the decoding speed.

Another object of the present invention is to provide a decoding system and method for high-density recording medium, which essentially performs accesses to a high-speed first memory and reduces accesses to a second memory having a lower speed relative to the first memory to thereby increase the use efficiency of the bandwidth of the second memory and further the system decoding performance.

According to a feature of the invention, a decoding system for a high-density recording medium is provided. The decoding system includes a first memory, a high protective codeword decoder, a burst indicator subcode (BIS) to long distance code (LDC) erasure generator, a second memory and a low protective codeword decoder. The first memory stores a high protective codeword. The high protective codeword decoder is connected to the first memory in order to decode and correct the high protective codeword to the first memory to thereby produce a BIS erasure indicator with a position information. The BIS to LDC erasure generator is connected to the first memory in order to, based on the BIS erasure indicator, produce an LDC erasure bit for a low protective codeword. The second memory stores the low protective codeword. The low protective codeword decoder is connected to the second memory and the BIS to LDC erasure generator in order to decode and correct the low protective codeword to the second memory. In decoding, the low protective codeword decoder first directly decodes and corrects the low protective codeword, and then decodes and corrects the low protective codeword based on the LDC erasure bit when the low protective codeword exceeds a decoding capability of the low protective codeword decoder.

According to another feature of the invention, a decoding system for a high-density recording medium is provided. The decoding system includes a demodulator, a first de-interleaver, a first memory, a high protective codeword decoder, a burst indicator subcode (BIS) to long distance code (LDC) erasure generator, a second memory, a second de-interleaver and a low protective codeword decoder. The demodulator receives a modulation signal and performs a demodulation operation on the modulation signal to thereby produce a demodulation signal, wherein the demodulation signal has high and low protective codewords. The first de-interleaver is coupled to the demodulator in order to receive the demodulation signal and perform a de-interleaving operation on the high protective codeword of the demodulation signal to thereby produce a de-interleaved high protective codeword. The first memory is coupled to the first de-interleaver in order to store the de-interleaved high protective codeword. The high protective codeword decoder is connected to the first memory in order to decode and correct the de-interleaved high protective codeword to the first memory to thereby produce a BIS erasure indicator with a position information. The BIS to LDC erasure generator is connected to the first memory in order to depend on the BIS erasure indicator to produce an LDC erasure bit for a low protective codeword. The second memory is connected to the demodulator in order to store the low protective codeword of the demodulation signal. The second de-interleaver is coupled to the second memory in order to perform a de-interleaving operation on the low protective codeword to thereby produce a de-interleaved low protective codeword. The low protective codeword decoder is connected to the second memory and the BIS to LDC erasure generator in order to decode and correct the low protective codeword to the second memory. In decoding the low protective codeword decoder first directly decodes and corrects the low protective codeword, and then decodes and corrects the low protective codeword based on the LDC erasure bit when the low protective codeword exceeds a decoding capability of the low protective codeword decoder.

According to a further feature of the invention, a decoding method for a high-density recording medium is provided, which decodes a signal with high and low protective codewords. The decoding method includes the steps: (A) initializing a codeword counting variable; (B) determining whether a high protective codeword decoding is complete, and executing step (E) when the high protective codeword decoding is complete and otherwise step (C); (C) determining whether a low protective codeword is correctable, and correcting the low protective codeword when the low protective codeword is correctable and otherwise recording the low protective codeword in a table as an uncorrectable codeword; (D) increasing the codeword counting variable by one, and executing step (B); (E) determining whether all uncorrectable codewords in the table are completely decoded; and (F) producing an LDC erasure bit for a corresponding low protective codeword based on a BIS erasure indicator of the high protective codeword when the corresponding low protective codeword recorded in the table as an uncorrectable codeword is not decoded, and then decoding and correcting the corresponding low protective codeword based on the LDC erasure bit, and executing step (E).

According to another feature of the invention, a decoding method for a high-density recording medium is provided, which decodes a signal with high and low protective codewords. The decoding method includes the steps: (A) initializing a codeword counting variable; (B) determining whether a high protective codeword decoding is complete, and executing step (D) when the high protective codeword decoding is complete and otherwise step (C); (C) determining whether a low protective codeword is correctable, and waiting when the low protective codeword is not correctable, until the high protective codeword decoding is complete; (D) producing an LDC erasure bit for the low protective codeword based on a BIS erasure indicator of the high protective codeword, and decoding and correcting the low protective codeword based on the LDC erasure bit; and (E) determining whether a low protective codeword decoding concurrently activated with the high protective codeword decoding is complete, and ending when the low protective codeword decoding is complete.

Other objects, advantages, and novel features of the invention will become more apparent from the following detailed description when taken in conjunction with the accompanying drawings.

DETAILED DESCRIPTION OF THE PREFERRED EMBODIMENT

Figure 5:
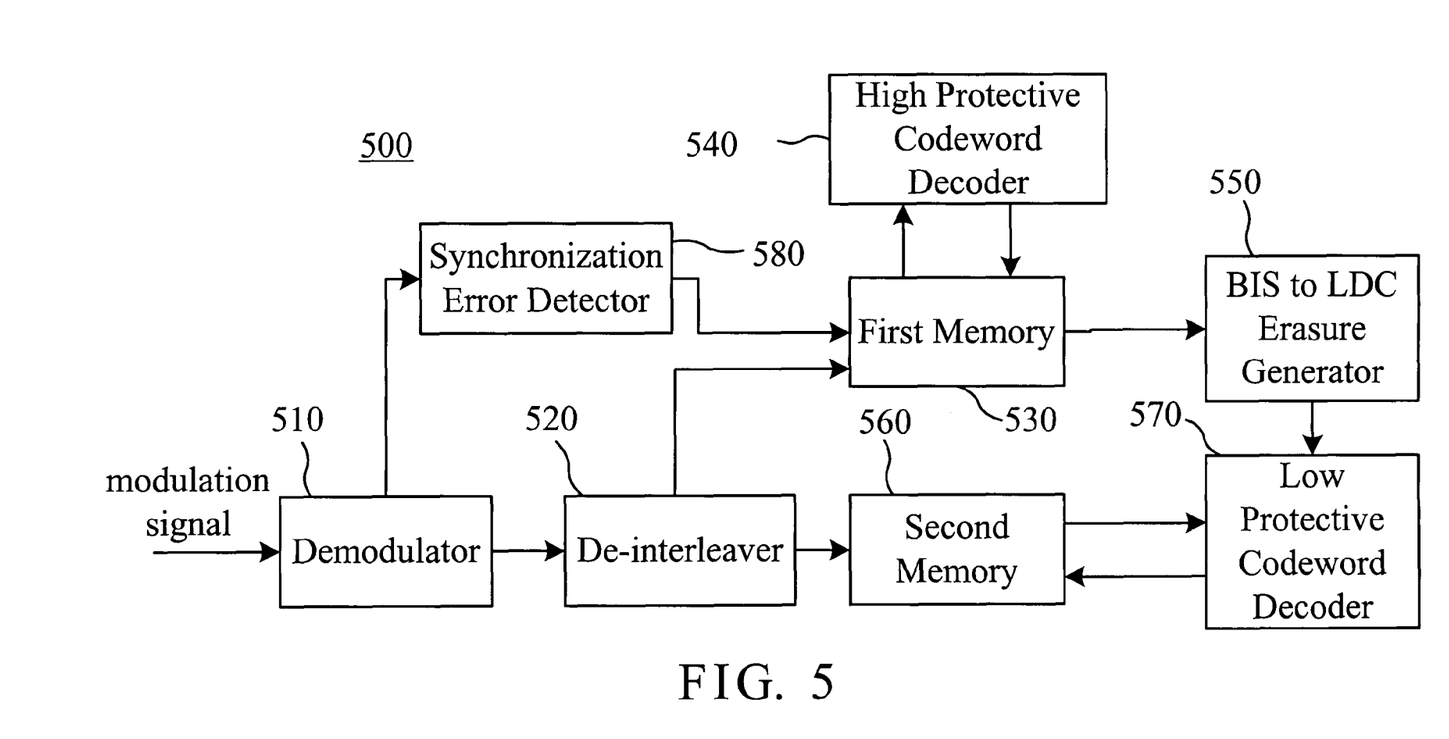
FIG. 5 is a block diagram of a decoding system for a high-density recording medium according to an embodiment of the invention.

FIG. 5 is a block diagram of a decoding system 500 for a high-density recording medium according to an embodiment of the invention. In FIG. 5, the decoding system 500 includes a demodulator 510, a de-interleaver 520, a first memory 530, a high protective codeword decoder 540, a burst indicator subcode (BIS) to long distance code (LDC) erasure generator 550, a second memory 560, a low protective codeword decoder 570 and a synchronization error detector 580.

The demodulator 510 receives a modulation signal and performs a demodulation operation on the modulation signal in order to produce a demodulation signal. The demodulation signal is an error correction code (ECC) cluster and has eight bits.

The de-interleaver 520 is coupled to the demodulator 510 in order to receive the demodulation signal and perform a de-interleaving operation on the demodulation signal to thereby produce the high and low protective codewords. The high protective codewords are a burst indicator subcode (BIS), and the low protective codewords are a long distance code (LDC).

Figure 6:
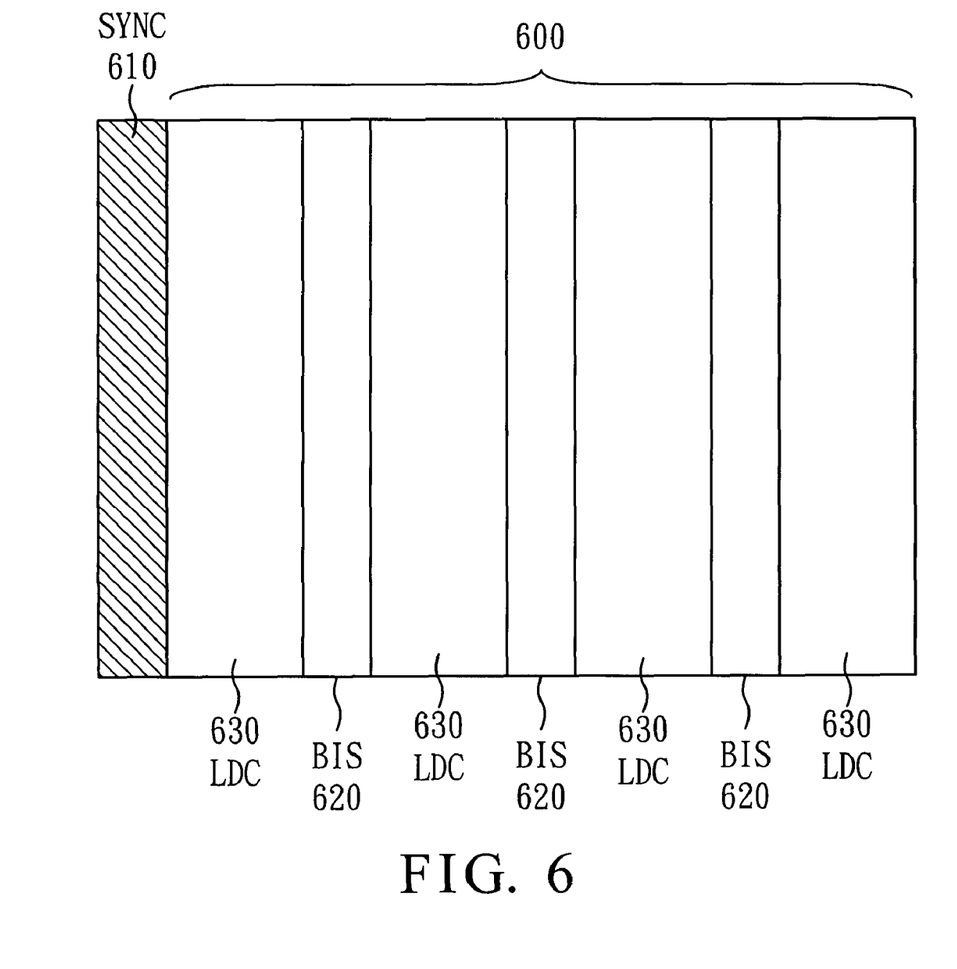
FIG. 6 is a schematic diagram of an error correction code (ECC) cluster according to an embodiment of the invention.

FIG. 6 is a schematic diagram of an error correction code (ECC) cluster 600 according to an embodiment of the invention. As shown in FIG. 6, the ECC cluster 600 includes three BIS data columns 620 and four LDC data blocks 630. A synchronization data column 610 is prefixed to the ECC cluster 600. Each LDC data block 630 has 38 LDC data columns, and in this case one ECC cluster 600 contains 152 (=38×4) LDC data columns. In addition, each ECC cluster 600 also contains 496 rows.

The LDC and BIS data in the ECC cluster 600 is demodulated into 8 bits by the demodulator 510 and subsequently de-interleaved by the de-interleaver 520. Accordingly, the high protective codewords (i.e., the BIS data) and the low protective codewords (i.e., the LDC data) are obtained. The LDC data is de-interleaved into 304 low protective codewords, each having a length of 248 bytes, and the BIS data is de-interleaved into 24 high protective codewords, each having a length of 62 bytes. Also, the synchronization code is sent to the synchronization error detector 580 in order to perform a synchronization error detection to thereby produce a synchronization erasure indicator.

The first memory 530 is coupled to the de-interleaver 520 in order to store the high protective codewords. Preferably, the first memory 530 is a static random access memory (SRAM).

The high protective codeword decoder 540 is connected to the first memory 530 in order to decode and correct the high protective codewords to the first memory 530 to thereby produce a BIS erasure indicator with a position information for each high protective codeword. For example, during decoding, the high protective codeword decoder 540 sets the BIS erasure indicator of the high protective codeword to "1" when an error is detected, and otherwise to "0". The BIS erasure indicator is positioned in a suitable place to thereby indicate the BIS data of the wrong ECC cluster corresponding to the BIS erasure indicator and further find the position relationship between the BIS erasure indicator and LDC data of the wrong ECC cluster 600.

The BIS to LDC erasure generator 550 is connected to the first memory 530 in order to produce the LDC erasure bits for the LDC data of the wrong ECC cluster 600 according to the BIS erasure indicator.

While the low protective codeword decoder 570 decodes the LDC data, the BIS to LDC erasure generator 550 can extract the BIS erasure indicators of a BIS data nearby the LDC data of the wrong ECC cluster 600 from the first memory 530. Thus, the BIS to LDC erasure generator 550 can produce the LDC erasure bits based on the BIS erasure indicators and send the bits to the low protective codeword decoder 570.

The second memory 560 is connected to the de-interleaver 520 in order to store the low protective codewords. The second memory 560 is a dynamic random access memory (DRAM).

The low protective codeword decoder 570 is connected to the second memory 560 and the BIS to LDC erasure generator 550 in order to decode and correct the low protective codeword to the second memory 560. On decoding, the low protective codeword decoder 570 first decodes and corrects the low protective codeword. When the low protective codeword exceeds a decoding capability of the low protective codeword decoder, the low protective codeword decoder 570 further decodes and corrects the low protective codeword based on the LDC erasure bit.

The synchronization error detector 580 is coupled to the demodulator 510 and the first memory 530 in order to detect the errors on the synchronization codes of the demodulation signal. When the errors of the synchronization codes of the demodulation signal are detected, the synchronization error detector 580 produces the synchronization erasure indicators and stores them in the first memory 530. The BIS to LDC erasure generator 550 is based on the BIS erasure indicators and the synchronization erasure indicators to produce the LDC erasure bits.

Upon the synchronization erasure indicators, the LDC erasure bits are produced. When the synchronization error detector 580 detects an error of a synchronization code, a synchronization erasure indicator corresponding to the erroneous synchronization code is set to "1", and otherwise to "0".

Since the synchronization data column 610 is not modulated in coding, for determining the errors of the synchronization codes, the demodulator 510 detects the positions of the erroneous synchronization code and sends all synchronization codes, which are not demodulated, directly to the synchronization error detector 580, and the synchronization error detector 580 analyzes the synchronization codes sent by the demodulator 510, groups them into legal and illegal ones, determines the illegal ones as the erroneous synchronization codes, sets the synchronization erasure indicators corresponding to the erroneous synchronization codes to "1" and otherwise to "0", and stores all synchronization erasure indicators in the first memory 530.

When the low protective codeword decoder 570 decodes an LDC data, the BIS to LDC erasure generator 550 can extract the BIS erasure indicator of a BIS data or the synchronization erasure indicator of a synchronization codeword nearby the LDC data of the wrong ECC cluster 600 from the first memory 530. Thus, the BIS to LDC erasure generator 550 can produce the LDC erasure bit based on the synchronization erasure indicator or the BIS erasure indicator.

Upon the ECC principles and algorithms, whether a codeword is correctable is known on decoding. Such a feature allows an LDC and a BIS to be concurrently decoded without the help of the LDC erasure bit, and the LDC decoding is paused until the LDC being decoded is an uncorrectable codeword. When the BIS decoding is complete, the BIS to LDC erasure generator 550 reads the BIS erasure indicator of a BIS from the first memory 530 to accordingly produce and transmit the LDC erasure bit to the low protective codeword decoder 570 for increasing the decoding performance of the low protective codeword decoder 570, so as to complete the decoding of the LDC which is determined to be uncorrectable by the low protective codeword decoder 570.

Figure 7:
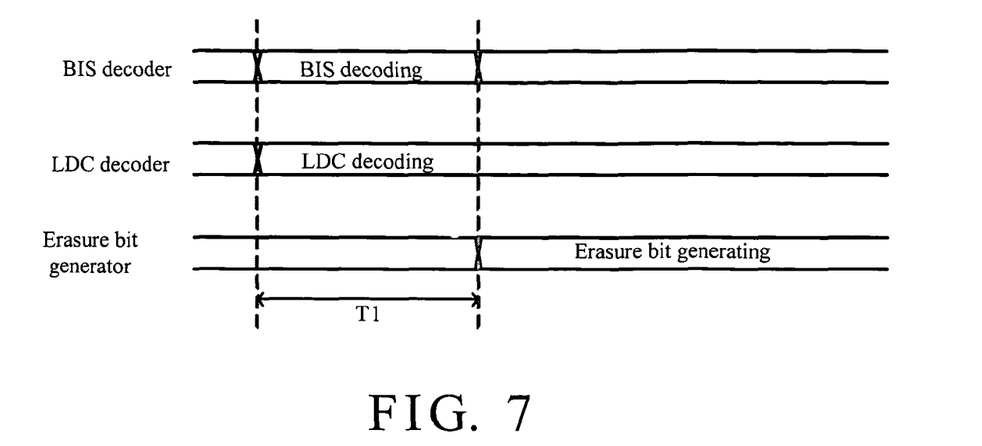
FIG. 7 is a decoding timing according to an embodiment of the invention.

Referring to FIG. 7, the low protective codeword decoder 570 and the high protective codeword decoder 540 concurrently start to decode. In this case, the BIS to LDC erasure generator 550 has no erasure bit when the BIS is not decoded completely. During the BIS decoding, the low protective codeword decoder 570 does not detect an LDC uncorrectable, so it can eliminate the time T1 waiting for completely decoding the BIS by the high protective codeword decoder 540. In this case, after the BIS is decoded completely, the BIS to LDC erasure generator 550 can obtain the BIS erasure indicator of the complete BIS. Next, the low protective codeword decoder 570 is based on the LDC erasure bit produced by the BIS to LDC erasure generator 550 to help the LDC decoding to thereby increase the decoding performance of the low protective codeword decoder 570 and eliminate the time T1.

Figure 8:
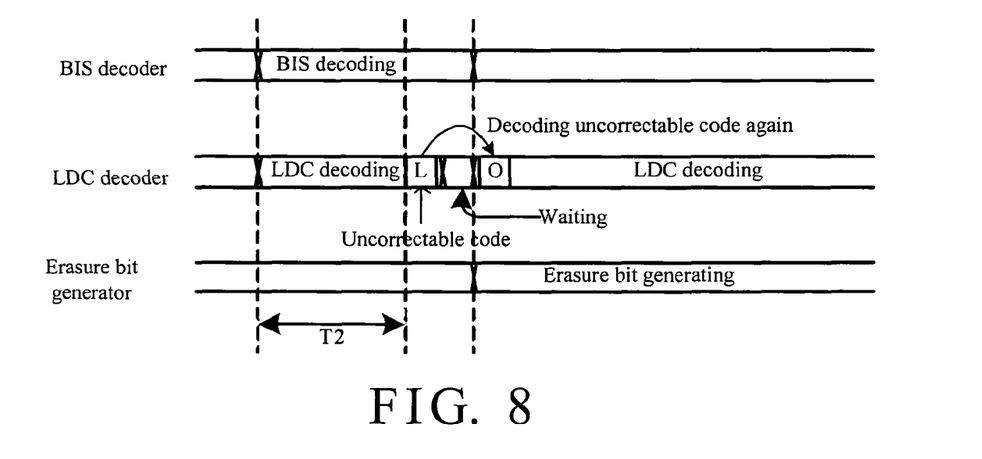
FIG. 8 is another decoding timing according to an embodiment of the invention.

The difference between FIGS. 7 and 8 is in that an uncorrectable LDC, numbered L, is seen by the low protective codeword decoder 570 during the time of a BIS decoding. Namely, the LDC L exceeds the decoding capability of the low protective codeword decoder 570, which makes the decoding operation of the low protective codeword decoder 570 pause until the BIS decoding is complete. When the BIS is completely decoded, the BIS to LDC erasure generator 550 can obtain the BIS erasure indicator of the complete BIS and store it in the first memory 530. In this case, the low protective codeword decoder 570 re-start to decode the LDC L while the BIS to LDC erasure generator 550 reads the BIS erasure indicator of the BIS from the first memory 530 to thereby produce the LDC erasure bit to the low protective codeword decoder 570 for the LDC L. Thus, the decoding performance of the low protective codeword decoder 570 on the LDC L is relatively increased. The low protective codeword decoder 570 and the BIS to LDC erasure generator 550 go on the remaining decoding operations after the LDC L is completely decoded to thereby complete the entire LDC decoding. Accordingly, it is clear that the low protective codeword decoder 570 can save the time T2 waiting for the BIS decoding operation of the high protective codeword decoder 540.

Figure 9:
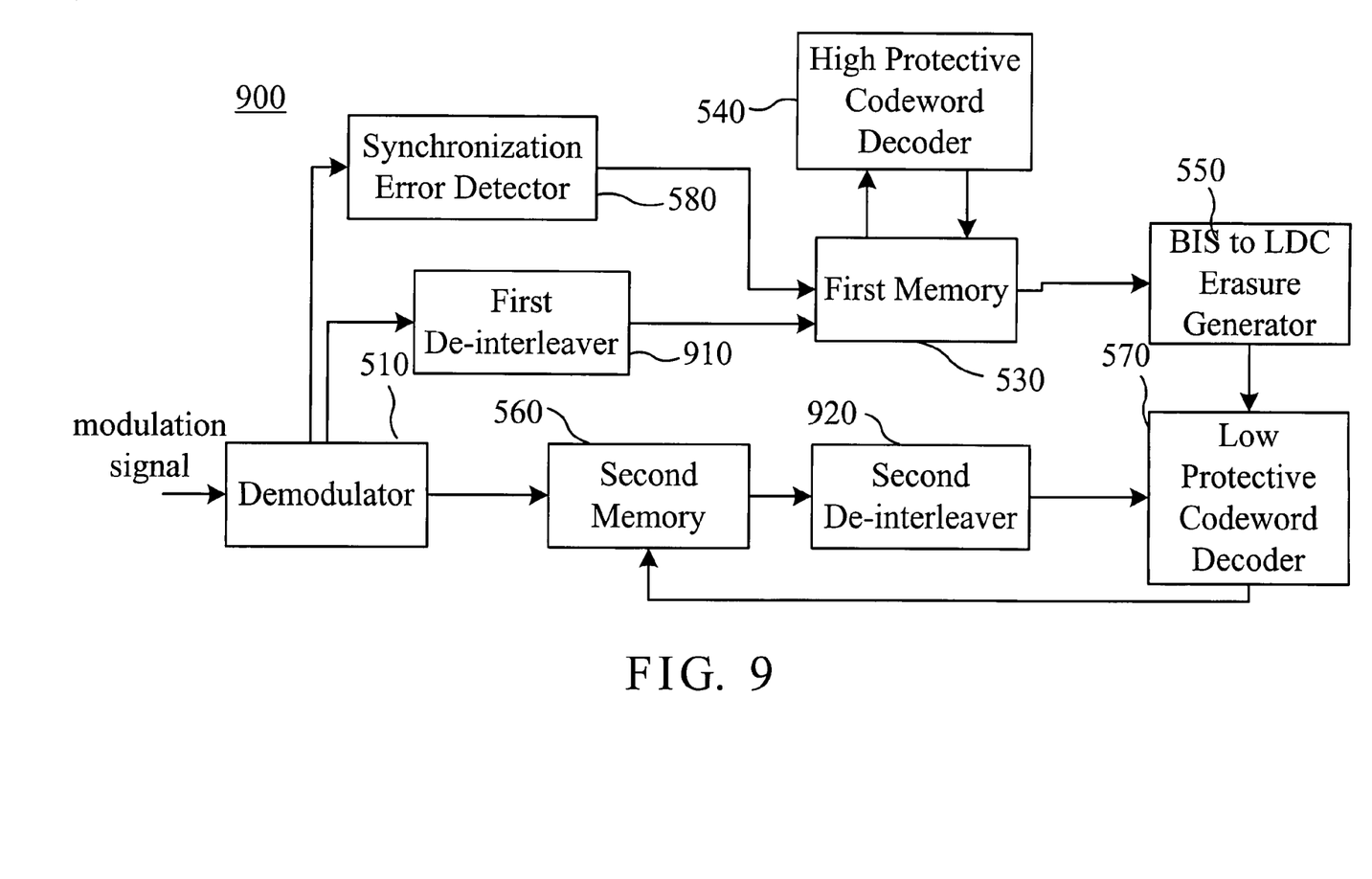
FIG. 9 is a block diagram of a decoding system for a high-density recording medium according to another embodiment of the invention.

FIG. 9 is a block diagram of a decoding system 900 for a high-density recording medium according to another embodiment of the invention. In FIG. 9, the decoding system 900 includes a demodulator 510, a first de-interleaver 910, a first memory 530, a high protective codeword decoder 540, a burst indicator subcode (BIS) to long distance code (LDC) erasure generator 550, a second memory 560, a second de-interleaver 920 and a low protective codeword decoder 570.

The demodulator 510 receives a modulation signal and performs a demodulation operation on the modulation signal to thereby produce a demodulation signal. The demodulation signal has high and low protective codewords. Each high protective codeword is a BIS, and each low protective codeword is an LDC.

The first de-interleaver 910 is coupled to the demodulator 510 in order to receive the demodulation signal and perform a de-interleaving operation on the high protective codeword of the demodulation signal to thereby produce a de-interleaved high protective codeword.

The first memory 530 is coupled to the first de-interleaver 910 in order to store the de-interleaved high protective codeword, i.e., the BIS. Preferably, the first memory 530 is a SRAM.

The high protective codeword decoder 540 is connected to the first memory 530 in order to decode and correct the de-interleaved high protective codeword to the first memory 530 to thereby produce a BIS erasure indicator with a position information.

The BIS to LDC erasure generator 550 is connected to the first memory 530 in order to depend on the BIS erasure indicator to produce an LDC erasure bit for a low protective codeword corresponding to the de-interleaved high protective codeword.

The second memory 560 is connected to the demodulator 510 in order to store the low protective codeword of the demodulation signal. Preferably, the second memory 560 is a DRAM.

The second de-interleaver 920 is coupled to the second memory 560 in order to perform a de-interleaving operation on the low protective codeword to thereby produce a de-interleaved low protective codeword.

The low protective codeword decoder 570 is connected to the second de-interleaver 920, the second memory 560 and the BIS to LDC erasure generator 550 in order to decode and correct the low protective codeword to the second memory 560.

The low protective codeword decoder 570 first decodes and corrects the low protective codeword in decoding. When the low protective codeword exceeds a decoding capability of the low protective codeword decoder 570, the low protective codeword decoder 570 then decodes and corrects the low protective codeword based on the LDC erasure bit.

The synchronization error detector 580 is coupled to the demodulator 510 and the first memory 530 in order to detect the erroneous synchronization code or codes of the demodulation signal. When one or more erroneous synchronization codes of the demodulation signal are detected, the synchronization error detector 580 produces synchronization erasure indicators and stores them in the first memory 530. The BIS to LDC erasure generator 550 is based on the BIS erasure indicators and the synchronization erasure indicators to produce the corresponding LDC erasure bits.

The difference between FIGS. 9 and 5 is in that the de-interleaver 520 in FIG. 5 is replaced with the first de-interleaver 910 and the second de-interleaver 920, and the connection of the second memory 560 is accordingly changed to present a new configuration.

Figure 10:
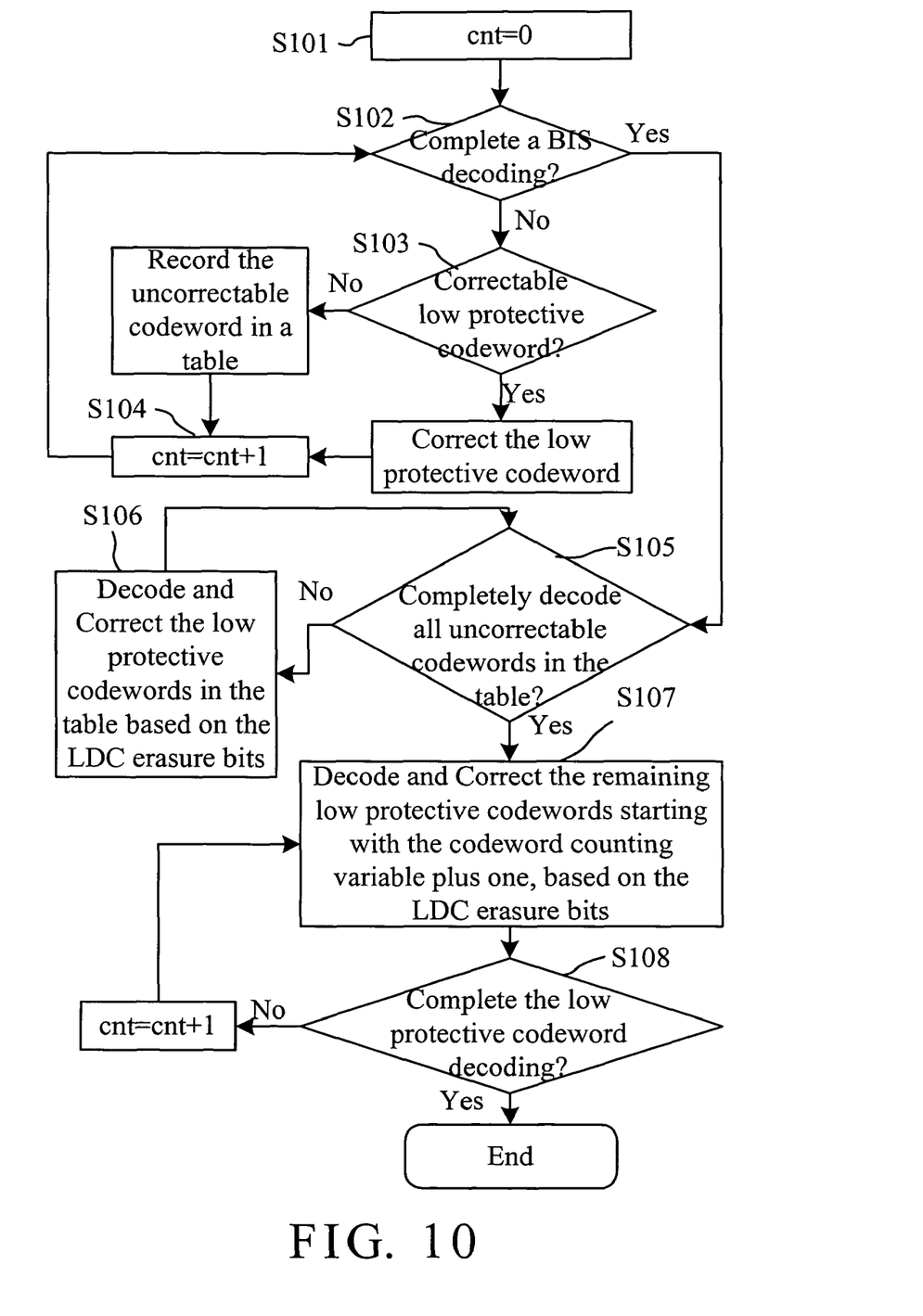
FIG. 10 is a flowchart of a decoding method for a high-density recording medium according to an embodiment of the invention.

FIG. 10 is a flowchart of a decoding method for a high-density recording medium according to an embodiment of the invention. The decoding method decodes a signal with high and low protective codewords. Step S101 initializes a codeword counting variable cnt and concurrently activates a BIS decoding and a LDC decoding.

Step S102 determines whether the high protective codeword (BIS) decoding is complete. When the high protective codeword decoding is complete, step S105 is executed, and otherwise step S103 is executed.

Step S103 determines whether a low protective codeword is correctable. When the low protective codeword is correctable, the low protective codeword is corrected, and otherwise it is recorded in a table as an uncorrectable codeword.

Step S104 increases the codeword counting variable cnt by one, and executes step S102.

Step S105 determines whether all uncorrectable codewords in the table are completely decoded. When all uncorrectable codewords in the table are completely decoded, step S107 is executed, and otherwise step S106 is executed.

When one or more uncorrectable codewords in the table are not decoded, step S106 produces an LDC erasure bit based on the BIS erasure indicator of the high protective codeword for each low protective codeword in order to decode and correct the low protective codewords in the table based on the LDC erasure bits, and then step S105 is executed.

When step S105 determines that all uncorrectable codewords in the table are completely decoded, step S107 is based on the LDC erasure bits to decode and correct the low protective codewords starting with the variable cnt plus one.

Step S108 determines whether the low protective codeword (LDC) decoding is complete. When the low protective codeword decoding is not complete, the codeword counting variable is increased by one, and step S107 is executed. Otherwise, the procedure ends.

Figure 11:
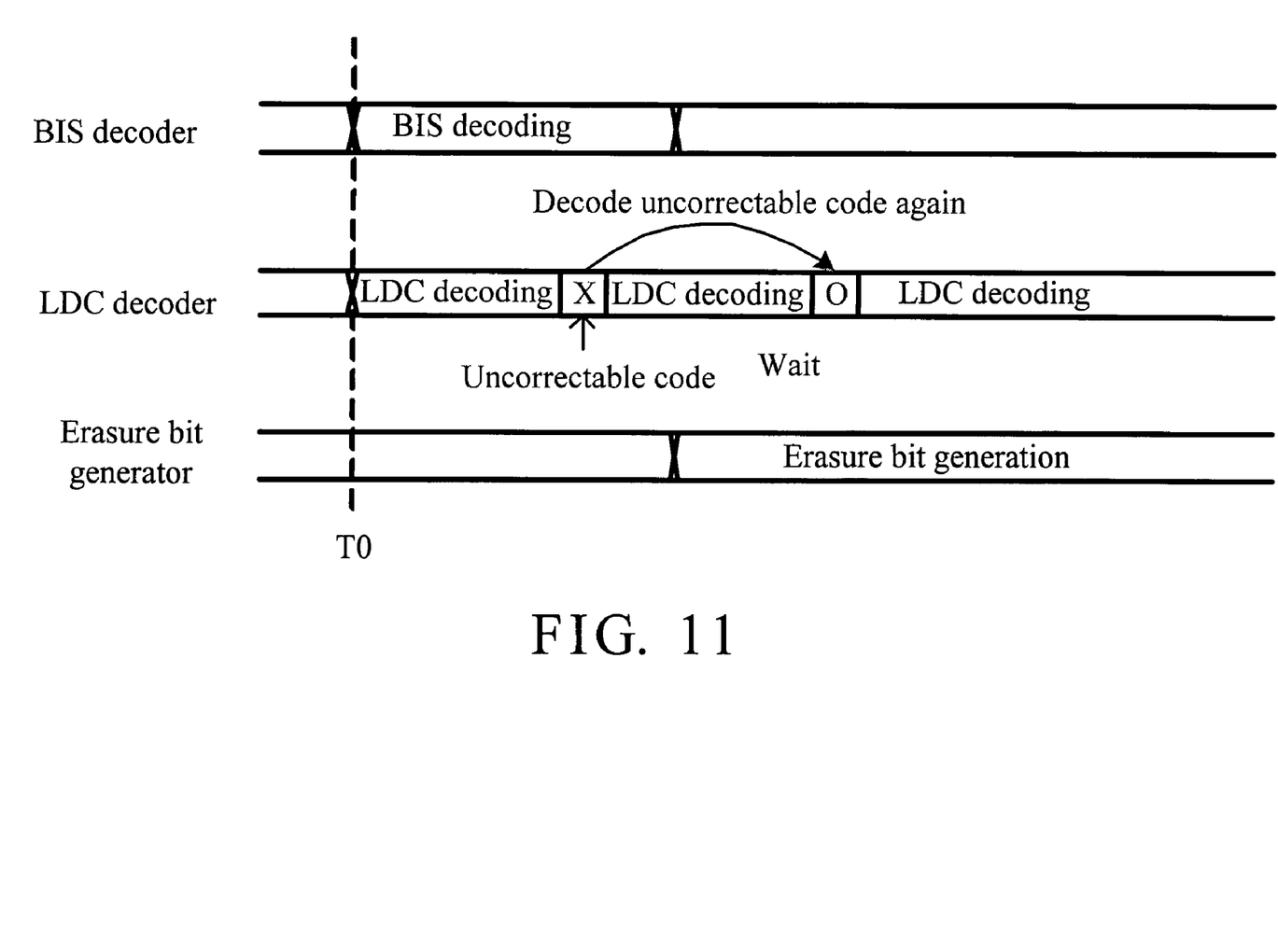
FIG. 11 is a decoding timing of FIG. 10 according to an embodiment of the invention.

FIG. 11 shows a decoding timing of FIG. 10 according to an embodiment of the invention. As shown in FIG. 11, at T0, the BIS decoding and the LDC decoding are concurrently performed. At the position X, the low protective codeword is uncorrectable and recorded in a table as an uncorrectable codeword. Next, the following low protective codewords are proceeded. When the BIS decoding is complete, the BIS erasure indicator is used to produce the LDC erasure bit in order to help decoding the uncorrectable codeword (indicated by "O") in the table. When all uncorrectable codewords in the table are completely decoded, the remaining low protective codewords starting with the codeword counting variable plus one are decoded and corrected.

Figure 12:
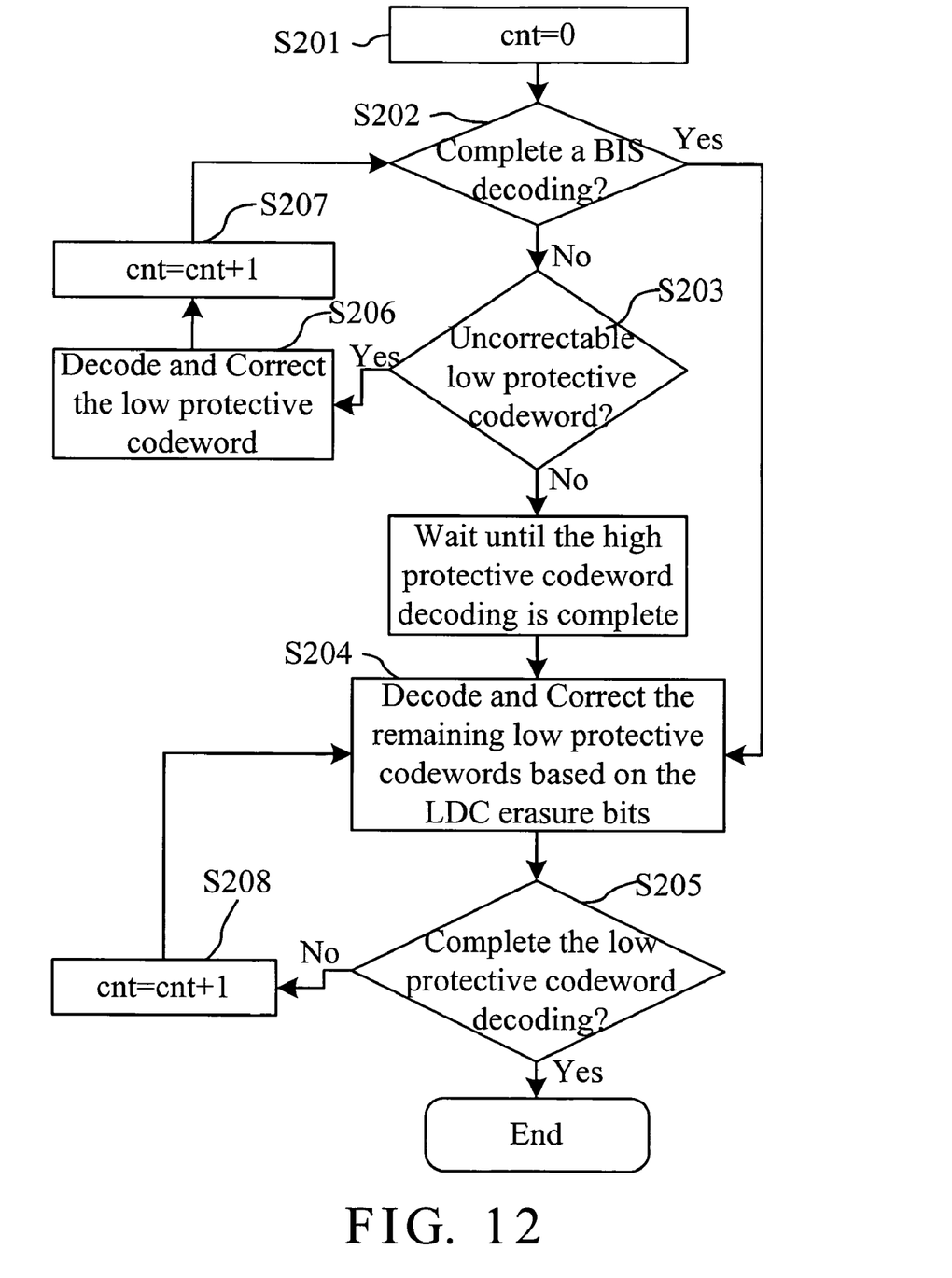
FIG. 12 is a flowchart of a decoding method for a high-density recording medium according to another embodiment of the invention.

FIG. 12 is a flowchart of a decoding method for a high-density recording medium according to another embodiment of the invention. The decoding method decodes a signal with high and low protective codewords. Step S201 initializes a codeword counting variable cnt and concurrently activates a BIS decoding and an LDC decoding.

Step S202 determines whether the high protective codeword (BIS) decoding is complete. When the high protective codeword decoding is complete, step S204 is executed, and otherwise step S203 is executed.

Step S203 determines whether a low protective codeword is correctable. When the low protective codeword is uncorrectable, the procedure is halted to wait for the completion of the high protective codeword decoding, i.e., the low protective codeword (LDC) decoding pauses until the high protective codeword decoding is complete and a BIS erasure indicator is produced.

Step S204 is based on the BIS erasure indicator to produce an LDC erasure bit to accordingly decode and correct the low protective codeword uncorrectable.

Step S205 determines whether the low protective codeword decoding is complete. When the low protective codeword decoding is complete, the procedure ends.

When step S203 determines that the low protective codeword is correctable, step S206 decodes and corrects the low protective codeword.

Step S207 increases the codeword counting variable by one, and executes step S202.

When step S205 determines that the low protective codeword decoding is not complete, step S208 increases the codeword counting variable by one, and executes step S204.

Figure 13:
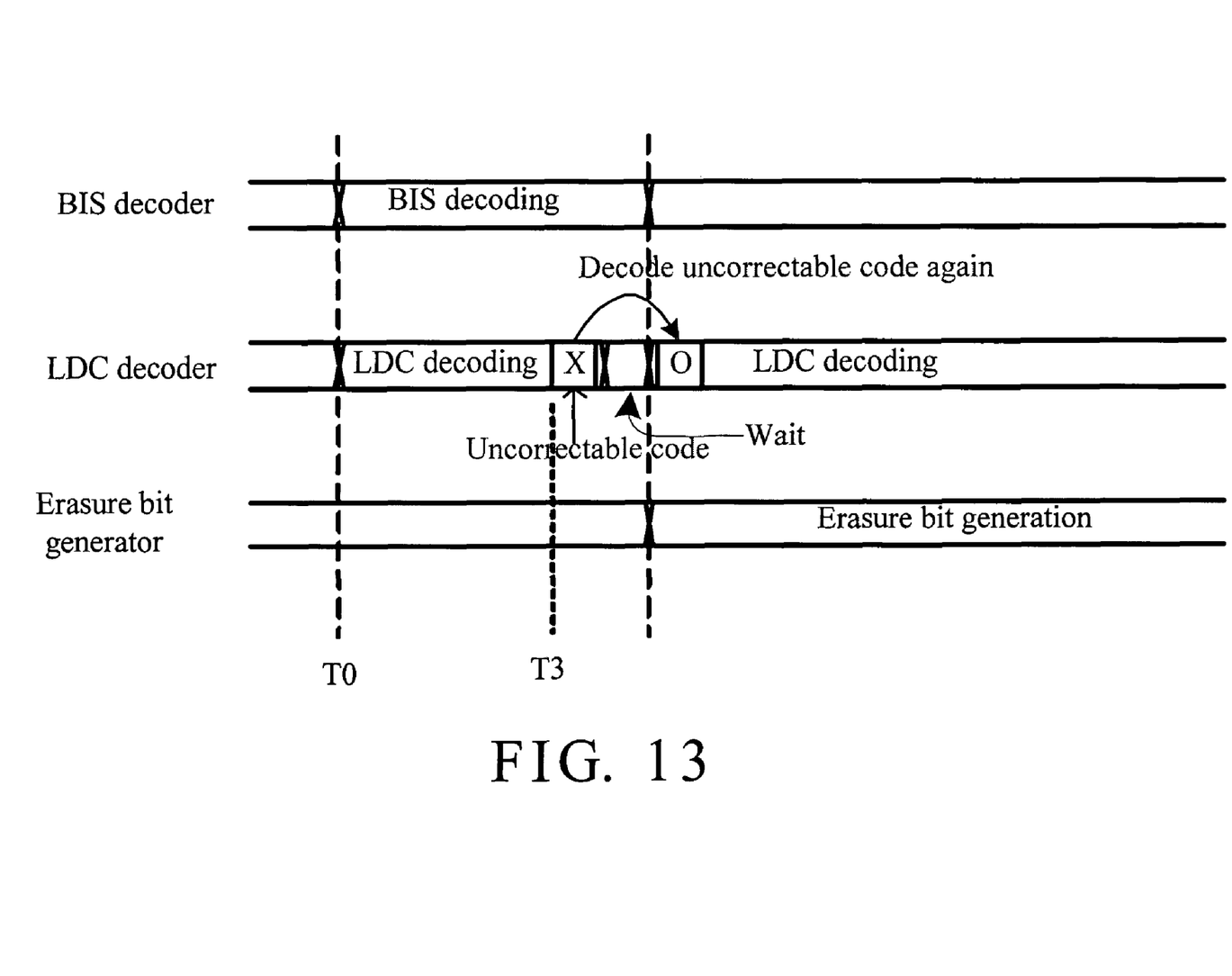
FIG. 13 is a decoding timing of FIG. 12 according to another embodiment of the invention.

FIG. 13 is a decoding timing of FIG. 12 according to another embodiment of the invention. As shown in FIG. 13, at T0, the BIS decoding and the LDC decoding are concurrently performed. At T3, the low protective codeword is uncorrectable, so the LDC decoding pauses to wait for completing the BIS decoding. When the BIS decoding is complete, the LDC decoding is proceeded to decode and correct the remaining low protective codewords based on the LDC erasure bits.

As cited, a typical decoding flow of high-density recording medium includes demodulation, de-interleaving, BIS decoding and LDC decoding executed in sequence. An LDC decoding cannot have enough BIS indicators to set the LDC erasure bits and enhance the LDC decoding performance of the low protective codeword decoder 570 except when the BIS decoding is complete. However, the LDC decoding and the BIS decoding can be concurrently performed in the invention. Accordingly, the waiting time for completing the BIS decoding is reduced or eliminated.

In addition, for the format of BIS blocks in the prior art, the coordinates of the de-interleaved BISs are not successive, i.e., not following the direction of each codeword. When the BISs are stored in the DRAM in a form to be conveniently decoded, such as the BIS blocks follow the direction of each codeword, it is inefficient and time-wasting for the DRAM accesses in that the de-interleaved BISs are written to the DRAM, the decoded BISs are corrected by reading the error bit information from the DRAM, and the corrected BISs are written back to the DRAM.

Therefore, the invention provides a decoding system and method for a high-density recording medium to reduce the decoding time, efficiently use the DRAM, save the bandwidth of the DRAM, and increase the decoding performance of a high-density recording medium, so as to meet the requirement of high-speed reading of a future high-density recording medium.

The invention allows the high protective codeword decoder 540 and the low protective codeword decoder 570 to work concurrently, so the BIS decoding and the LDC decoding can be performed concurrently, thereby eliminating the time waiting for completing the BIS decoding in the prior art. In addition, the invention uses the first memory 530, which has a higher access speed than the second memory 560, to store the BISs and BIS erasure indicators to thereby reduce the access to the second memory 560. Thus, the bandwidth of the second memory 560 can be used more efficient to thereby increase the decoding performance of the high-density recording medium and meet the requirement of high-speed reading of a future high-density recording medium.

Although the present invention has been explained in relation to its preferred embodiment, it is to be understood that many other possible modifications and variations can be made without departing from the spirit and scope of the invention as hereinafter claimed.

What is claimed is:

1. A decoding system for a high-density recording medium, comprising:
    a first memory for storing a high protective codeword;
    a high protective codeword decoder connected to the first memory for decoding the high protective codeword and correcting the high protective codeword into the first memory to produce a burst indicator subcode (BIS) erasure indicator with a position information;
    a BIS to LDC erasure generator connected to the first memory for producing a long-distance code (LDC) erasure bit for a low protective codeword based on the BIS erasure indicator;
    a second memory for storing the low protective codeword; and
    a low protective codeword decoder connected to the second memory and the BIS to LDC erasure generator for decoding the low protective codeword and correcting the low protective codeword into the second memory;
    wherein, during decoding, the low protective codeword decoder first decodes and corrects the low protective codeword, and then decodes and corrects the low protective codeword when the low protective codeword exceeds a decoding capability of the low protective codeword decoder.

2. The system as claimed in claim 1, further comprising a de-interleaver coupled to the first memory and the second memory for receiving a demodulation signal and de-interleaving the demodulation signal to produce the high protective codeword and the low protective codeword.

3. The system as claimed in claim 2, further comprising a demodulator coupled to the de-interleaver for receiving a modulation signal and demodulation the modulation signal to produce the demodulation signal.

4. The system as claimed in claim 3, further comprising a synchronization error detector coupled to the demodulator and the first memory for detecting an error in the synchronization codes of the demodulation signal, producing a synchronization erasure indicator when the error in the synchronization codes is detected, and storing the synchronization erasure indicator in the first memory, wherein the BIS to LDC erasure generator produces the LDC erasure bit based on the BIS erasure indicator and the synchronization erasure indicator.

5. The system as claimed in claim 4, wherein the demodulation signal is an error correction code (ECC) cluster, the high protective codeword is a BIS, and the low protective codeword is an LDC.

6. The system as claimed in claim 5, wherein the first memory is a static random access memory (SRAM).

7. The system as claimed in claim 6, wherein the second memory is a dynamic random access memory (DRAM).

8. A decoding system for a high-density recording medium, comprising:
    a demodulator for receiving a modulation signal and demodulating the modulation signal to produce a demodulation signal, wherein the demodulation signal has high and low protective codewords;

a first de-interleaver coupled to the demodulator for receiving the demodulation signal and de-interleaving the high protective codeword of the demodulation signal to produce a de-interleaved high protective codeword;

a first memory coupled to the first de-interleaver for storing the de-interleaved high protective codeword;

a high protective codeword decoder connected to the first memory for decoding the de-interleaved high protective codeword and correcting the de-interleaved high protective codeword in the first memory to produce a BIS erasure indicator with a position information;

a BIS to LDC erasure generator connected to the first memory for producing an LDC erasure bit, based on the BIS erasure indicator, for a low protective codeword;

a second memory connected to the demodulator for storing the low protective codeword of the demodulation signal;

a second de-interleaver coupled to the second memory for de-interleaving the low protective codeword to thereby produce a de-interleaved low protective codeword; and a low protective codeword decoder connected to the second memory and the BIS to LDC erasure generator for decoding the low protective codeword and correcting the low protective codeword in the second memory;

wherein, in decoding, the low protective codeword decoder first decodes and corrects the low protective codeword, and then decodes and corrects the low protective codeword based on the LDC erasure bit when the low protective codeword exceeds a decoding capability of the low protective codeword decoder.

9. The system as claimed in claim 8, further comprising a synchronization error detector coupled to the demodulator and the first memory for detecting an error in the synchronization codes of the demodulation signal, producing a synchronization erasure indicator when the error in the synchronization codes is detected, and storing the synchronization erasure indicator in the first memory, wherein the BIS to LDC erasure generator produces the LDC erasure bit based on the BIS erasure indicator and the synchronization erasure indicator.

10. The system as claimed in claim 9, wherein the demodulation signal is an error correction code (ECC) cluster, the high protective codeword is a BIS, and the low protective codeword is an LDC.

11. The system as claimed in claim 10, wherein the first memory is a static random access memory (SRAM).

12. The system as claimed in claim 11, wherein the second memory is a dynamic random access memory (DRAM).

13. A decoding method for a high-density recording medium, which decodes a signal with high protective codewords and low protective codewords, the method comprising the steps of:
- (A) initializing a codeword counting variable;
- (B) determining whether a high protective codeword decoding is complete, and executing step (E) when the high protective codeword decoding is complete and otherwise step (C);
- (C) determining whether a low protective codeword is correctable, and correcting the low protective codeword when the low protective codeword is correctable or otherwise recording the low protective codeword in a table as an uncorrectable codeword;
- (D) increasing the codeword counting variable by one, and executing step (B);
- (E) determining whether all uncorrectable codewords in the table are completely decoded; and
- (F) if all uncorrectable codewords in the table are not completely decoded, producing an LDC erasure bit for a corresponding low protective codeword based on a BIS erasure indicator of the high protective codeword, then decoding and correcting the corresponding low protective codeword based on the LDC erasure bit, and executing step (E).

14. The method as claimed in claim 13, further comprising the steps of:
- (G) if all uncorrectable codewords in the table are completely decoded, increasing the codeword counting variable by one based on the LDC erasure bit of each low protective codeword to decode and correct remaining low protective codewords; and
- (H) determining whether a low protective codeword decoding concurrently activated with the high protective codeword decoding is complete, if the decoding is complete, increasing the codeword counting variable by one and executing step (G), or otherwise ending the decoding.

15. The method as claimed in claim 14, wherein the demodulation signal is an error correction code (ECC) cluster, the high protective codeword is a BIS, and the low protective codeword is an LDC.

16. A decoding method for a high-density recording medium, which decodes a signal with high and low protective codewords, the method comprising the steps of:
- (A) initializing a codeword counting variable;
- (B) determining whether a high protective codeword decoding is complete, if the decoding is complete, executing step (D), or otherwise executing step (C);
- (C) determining whether a low protective codeword is uncorrectable, if the low protective codeword is uncorrectable, continue decoding until the high protective codeword decoding is complete;
- (D) producing an LDC erasure bit for the low protective codeword based on a BIS erasure indicator of the high protective codeword, and decoding and correcting the low protective codeword based on the LDC erasure bit; and
- (E) determining whether a low protective codeword decoding is complete, and ending when the decoding is complete.

17. The method as claimed in claim 16, further comprising the steps of:
- (F) decoding and correcting the low protective codeword when it is determined that the low protective codeword is correctable in step (c); and
- (G) increasing the codeword counting variable by one, and executing step (B).

18. The method as claimed in claim 17, further comprising the step of:
- (H) increasing the codeword counting variable by one and executing step (D) when step (E) determines that the low protective codeword decoding is not complete.

19. The method as claimed in claim 18, wherein the demodulation signal is an error correction code (ECC) cluster, the high protective codeword is a BIS, and the low protective codeword is an LDC.

* * * * *